United States Patent
Shibagaki et al.

(10) Patent No.: US 7,732,739 B2
(45) Date of Patent: Jun. 8, 2010

(54) SUBSTRATE HEAT TREATMENT APPARATUS AND SUBSTRATE TRANSFER TRAY USED IN SUBSTRATE HEAT TREATMENT

(75) Inventors: Masami Shibagaki, Fuchu (JP); Yasumi Kurematsu, Fuchu (JP)

(73) Assignee: Canon Anelva Corporation, Fuchu-Shi, Tokyo (JP)

( * ) Notice: Subject to any disclaimer, the term of this patent is extended or adjusted under 35 U.S.C. 154(b) by 0 days.

(21) Appl. No.: 11/660,042

(22) PCT Filed: Oct. 18, 2005

(86) PCT No.: PCT/JP2005/019090

§ 371 (c)(1), (2), (4) Date: Feb. 12, 2007

(87) PCT Pub. No.: WO2006/043530

PCT Pub. Date: Apr. 27, 2006

(65) Prior Publication Data

US 2007/0194001 A1    Aug. 23, 2007

(30) Foreign Application Priority Data

Oct. 19, 2004    (JP) .............................. 2004-303873

(51) Int. Cl.
*F27B 5/14*    (2006.01)
*F26B 19/00*    (2006.01)

(52) U.S. Cl. .................. 219/390; 219/405; 219/411; 392/416; 392/418; 118/724; 118/725; 118/50.1; 118/728; 118/729

(58) Field of Classification Search ................. 219/390, 219/405, 411; 392/416, 418; 118/724, 725, 118/50.1, 728, 729
See application file for complete search history.

(56) References Cited

U.S. PATENT DOCUMENTS

| | | | | |
|---|---|---|---|---|
| 5,881,208 A | * | 3/1999 | Geyling et al. | .............. 392/418 |
| 2006/0249073 A1 | | 11/2006 | Asaoka et al. | |

FOREIGN PATENT DOCUMENTS

| | | |
|---|---|---|
| EP | 0 519 608 | 12/1992 |
| JP | 1-145312 A | 6/1989 |
| JP | H01-145312 | 6/1989 |
| JP | 404352678 | * 12/1992 |
| JP | 10-144618 | 5/1998 |
| JP | 10-144618 A | 5/1998 |
| JP | 2912913 B1 | 6/1999 |
| JP | 2004-297034 A | 10/2004 |
| JP | 2006-28625 | * 2/2006 |
| WO | 97/13011 A1 | 4/1997 |

OTHER PUBLICATIONS

*International Search Report dated Jan. 24, 2006.

* cited by examiner

*Primary Examiner*—Shawntina Fuqua
(74) *Attorney, Agent, or Firm*—Buchanan Ingersoll & Rooney PC

(57) ABSTRACT

A degassing from a susceptor heated at a high temperature in a vacuum atmosphere is suppressed. The susceptor is disposed between a heater and a substrate and partitions a space in the chamber into a first chamber space where the heater is placed and a second chambers space where the substrate is placed, and the surface of the susceptor facing the second chamber space is coated with a pyrolytic carbon layer (15) of thickness of 10 μm to 50 μm.

6 Claims, 9 Drawing Sheets

(PRIOR ART)

SUBSTRATE HEAT TREATMENT APPARATUS AND SUBSTRATE TRANSFER TRAY USED IN SUBSTRATE HEAT TREATMENT

TECHNICAL FIELD

The present invention relates to a substrate heat treatment apparatus that may be used for semiconductor substrate heating and a substrate transfer tray that may be used in conjunction with the substrate heat treatment apparatus during the substrate heating process.

BACKGROUND

The heat treatment or thermal process that may be performed for semiconductor substrates at high temperature has been used widely. The heat treatment process widely used in semiconductor manufacturing process is the rapid thermal process or rapid thermal annealing (which may be referred to hereinafter "RTP"). The purpose of the heat treatment process is intended to activate the implanted impurities by the re-crystallization of damaged substrate causing ion implantation.

The conventional apparatus is primarily intended to allow semiconductor substrates placed in the vacuum to be heated rapidly by heating means. In the example shown in FIG. 9, a substrate 23 may be placed on a susceptor 25 incorporating a heating means 24 and which is arranged in the chamber that can be evacuated (not shown), and may then be heated rapidly. Alternatively, the substrate 23 placed on the susceptor 25 may be heated by radio frequency inductive heating means, thermoelectron generator means for the electron impact heating, an infrared lamp used for the infrared lamp heating or the like which are not shown.

The conventional heat treatment processes described above are disclosed in Japanese patent application No. H10-144618, IPO bulletin WO97/13011, and Japanese patent No. 2912913, for example.

SUMMARY

Problems to be Solved

The heat treatment process for semiconductor substrates, particularly the heat treatment process for silicon carbide (SiC) substrates is required to perform at high temperatures of between 1500° C. and 2000° C. When those semiconductor substrates are heated at such high temperatures during the heat treatment process, there is a problem in that surface roughening is likely to occur on the implanted substrates.

For the SiC substrates, as they have the material property that may cause a low thermal diffusion, the electrical conductive control is provided by ion implantation. Thus, when impurity ions which are accelerated with high energy are implanted into the SiC substrate, the SiC crystal is damaged. The heat treatment process is required to make a re-crystallization for an almost amorphous substrate.

This high temperature annealing often induces surface roughening of the SiC substrate. This surface roughening also decreases the channel mobility of MOSFET (Metal oxide semiconductor field effect transistor).

More specifically, if the SiC substrate has surface roughening as described above when it is used to fabricate the MOSFET transistor, a gate insulating film may be formed on the rough surface of the SiC substrate. Thus, the good interface cannot be obtained. As a result, the performance of the transistor may be degraded. When metal is simply provided as a contact, there is also a problem in that the metal that contacts the rough surface may cause the contact resistance to be increased.

It is therefore an object of the present invention to provide a substrate heat treatment apparatus that may be used for the substrate heat treatment process in which semiconductor substrates can be heated at high temperatures and a substrate transfer tray that may be used in conjunction with the apparatus during the substrate heat treatment process, wherein surface roughening during the heat treatment process can be avoided, while at the same time the substrate heat treatment process can be performed efficiently.

Means for Solving the Problem

In order to achieve the above object and solve the problems associated with the prior art described above, the substrate heat treatment apparatus includes a susceptor that is disposed between a heating means and a substrate (semiconductor substrate that is processed thermally), wherein the surface of the susceptor that is located on the side thereof on which the substrate is placed is covered with any suitable material that will not degas during the heat treatment process.

The apparatus further includes a heat receiving body for receiving the heat from the heating means through the susceptor, wherein the heat receiving body is arranged on the side thereof facing the susceptor, with the substrate being placed between the susceptor and heat receiving body and wherein the surface of the heat receiving body located on the side thereof on which the substrate is placed can also be covered with any suitable material that will not degas during the heat treatment process.

The susceptor may incorporate the heating means and the substrate can be placed on the upper side of the susceptor. The substrate transfer tray proposed by the present invention and which may be used in conjunction with the substrate heat treatment apparatus during the heat treatment process includes a substrate supporting portion that may be placed on the susceptor and on the upper side of which the substrate may be placed, wherein the substrate supporting portion has the outer periphery that is larger than the outer periphery of the susceptor, and at least the upper side of the substrate supporting portion is covered with any suitable material that will not discharge gases during the heat treatment process.

Effects

In accordance with the substrate heat treatment apparatus and substrate transfer tray, semiconductor substrates can be processed thermally at high temperatures in such a manner as to prevent rough surfaces from occurring on the substrates being processed thermally, while the heat treatment process can proceed efficiently.

As the heat treatment process can proceed at the high temperatures of between 1500° C. and 2000° C., it can occur efficiently for the SiC substrates on which rough surfaces are likely to be produced easily, without producing such rough surfaces during the heat treatment process.

The substrate transfer tray that may be used in conjunction with the substrate heat treatment apparatus during the heat treatment process is constructed to avoid that degas from the tray during the heat treatment process. Thus, the risk of surface roughening on the substrates can be avoided, and the heat treatment process can occur efficiently for more than one substrate in sequence.

DETAILED DESCRIPTION OF PREFERRED EMBODIMENTS

Figure 1:
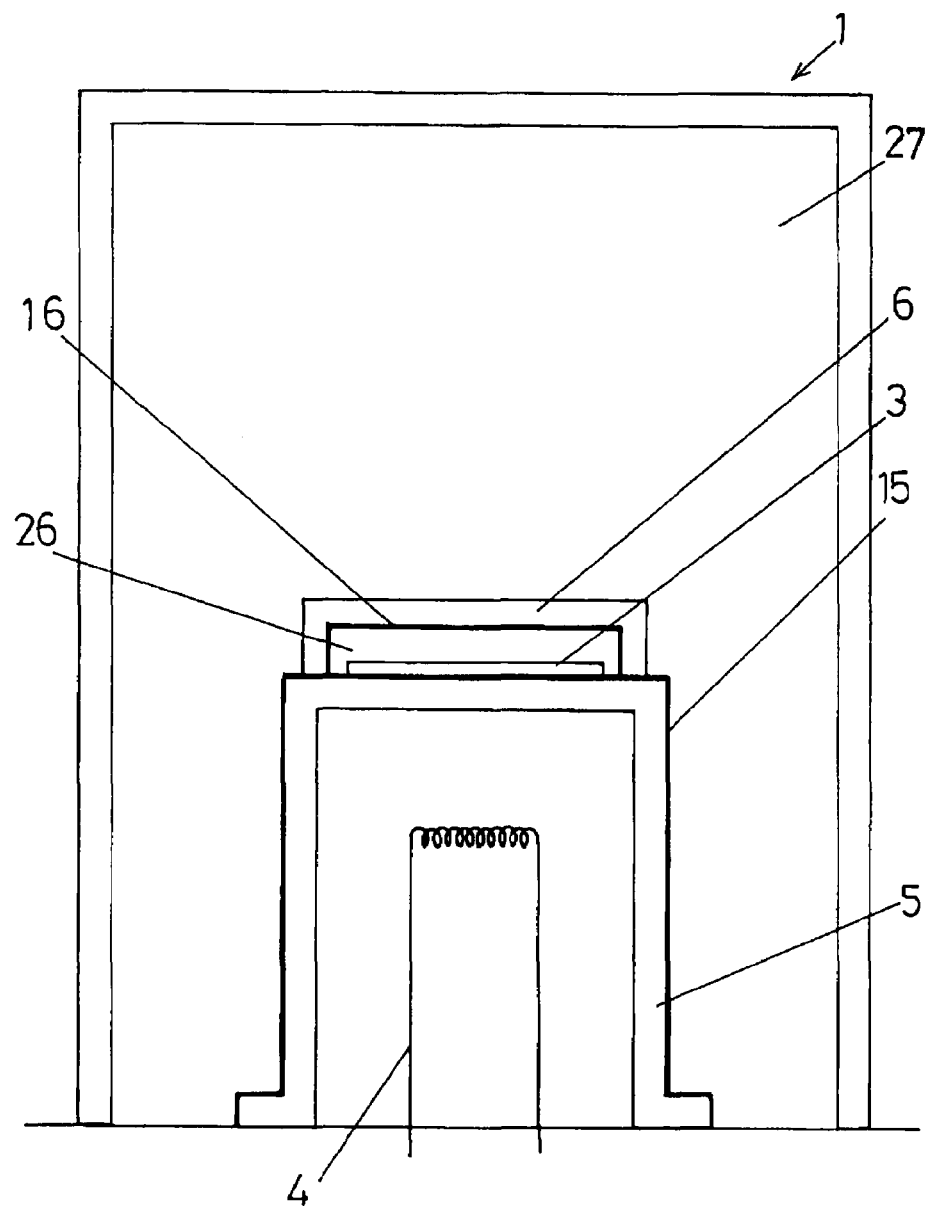
FIG. 1 is a cross sectional view illustrating the substrate heat treatment apparatus in accordance with a first embodiment of the present invention, although some parts or elements are not shown.

The substrate heat treatment apparatus includes a heater or heating means for heating a substrate (typically semiconductor substrate being processed thermally) that is placed in a process chamber that can be evacuated, wherein the apparatus can process a substrate thermally by heating it by the heating means. In accordance with one embodiment of the present invention, the substrate heat treatment apparatus further includes a susceptor that is disposed between the heating means and the substrate being processed thermally, wherein the surface of the susceptor located on the side thereof on which the substrate is placed may be covered with any suitable material that will not degas during the heat treatment process.

In accordance with the substrate heat treatment apparatus, the susceptor disposed between the substrate being processed thermally and the heating means can be maintained at a predetermined temperature so that the susceptor can convey the heat to the substrate uniformly. Thus, the surface of the susceptor located on the side thereof on which the substrate is placed may be covered with any suitable material that will not degas during the heat treatment process. Even if the susceptor is heated at high temperatures, such as, for example, the temperatures between 1500° and 2000°, gases can be prevented from being emitted from the susceptor. This ensures that the substrate can be processed thermally without causing any surface roughening to occur on the substrate.

In order to ensure that the purpose of preventing the surface roughening on the substrate that might possibly be caused by the gases from the susceptor during the heat treatment process can be achieved more effectively, the surface of the susceptor located on the side thereof on which the substrate is placed should preferably be covered with any suitable material that will not degas during the heat treatment process.

As a variation of the embodiment of the substrate heat treatment apparatus described above, the apparatus may further include a heat receiving body for receiving the heat from the heating means through the susceptor, wherein the heat receiving body is disposed on the side that faces the susceptor with the substrate (typically, the semiconductor substrate being processed thermally) being placed between the susceptor and the heat receiving body, and wherein the surface of the heat receiving body located on the side thereof on which the substrate is placed may be covered with any suitable material that will not degas during the heat treatment process.

In accordance with the above variation of the substrate heat treatment apparatus in which the heat receiving body for receiving the heat from the heating means through the susceptor is provided, with the substrate being placed between the susceptor and heat receiving body, the heat receiving body may also be heated by the heating means so that it can produce the radiant heat. Thus, the substrate can be heated more effectively by the radiant heat from the heat receiving body. Furthermore, the surface of the heat receiving body located on the side thereof on which the substrate is placed may also be covered with any suitable material that does not degas from the heat receiving body that is exposed to the high temperatures of between about 1500° C. and 2000° C., for example. The surface roughening can also be prevented from occurring on the substrate.

In the substrate heat treatment apparatus described above, the heating means may be incorporated into the susceptor, and the substrate (typically, the semiconductor substrate) being processed thermally may be placed on the upper side of the susceptor.

In this case, the heat receiving body may have the form of a cap that can cover the substrate from above the susceptor, and separate the substrate from the space inside the treatment chamber. The surface of the cap located on the side thereof facing the substrate may be covered with any suitable material that will not degas during the heat treatment process.

For example, when the substrate is placed directly on the susceptor incorporating the heating means, the substrate will be able to be heated uniformly and directly by the susceptor. As the substrate is placed on the susceptor that is covered by the cap from the above, and is separated by the cap from the space inside the treatment chamber, the substrate can be heated more effectively by the radiant heat from the heat receiving body or cap.

In the above embodiment in which the substrate may be placed directly on the susceptor incorporating the heating means, the upper side of the susceptor on which the substrate is placed and the surface of the cap facing the side on which the substrate is placed or the inner side of the cap separating the substrate from the space inside the treatment chamber can be covered with any suitable material that will not discharge gases during the heat treatment process. This prevents the gases from being emitted from the susceptor and cap into the space inside the treatment chamber separated by the cap from the substrate being processed thermally, and thus prevents the surface roughening from occurring on the substrate more effectively.

In those cases, in order to ensure that the purpose of preventing the degas from the heat receiving body or cap and thus preventing the surface roughening from occurring on the substrate during the heat treatment process can be achieved more effectively, it is preferred that the surface of the heat receiving body located on the side thereof on which the substrate is placed, or more specifically, the entire surface of the heat receiving body from which the gases can be desorbed during the heat treatment process, should be covered with any suitable material that will not degas. It is also preferred that the surface of the cap facing the side on which the substrate is placed, or more specifically, the entire surface of the cap from which the gases can be emitted during the heat treatment process should be covered with any suitable material that will not degas.

In the substrate heat treatment apparatus described above, an example of the substrates (typically, semiconductor substrates) being processed thermally may be SiC substrates.

The heating means may include the thermoelectron generator means for the electron impact heating, the infrared lamp for the infrared lamp heating and the like.

Figure 8A:
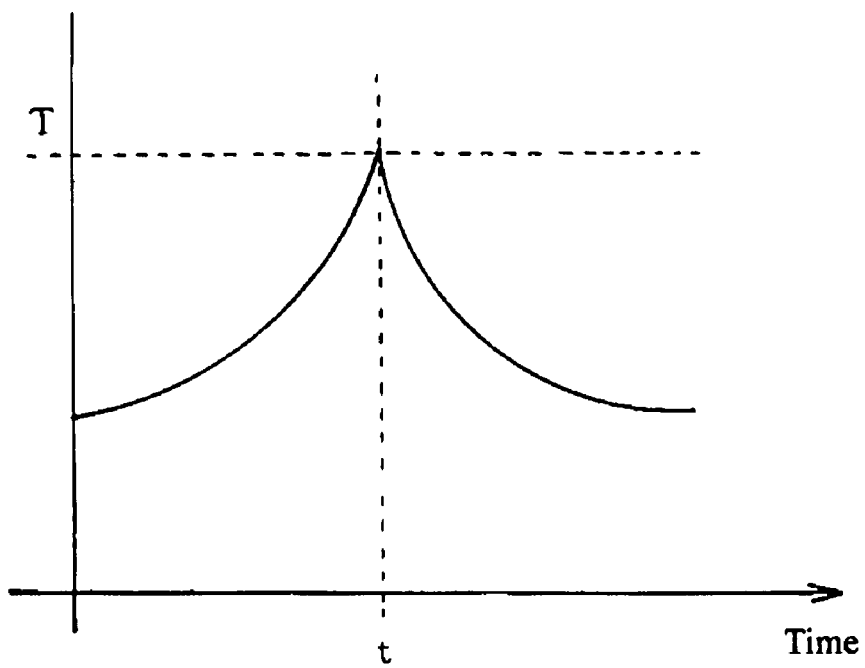
FIG. 8(a) is a temperature program curve showing one example of the heat treatment process that may occur in the substrate heat treatment apparatus of the present invention.
Figure 8B:
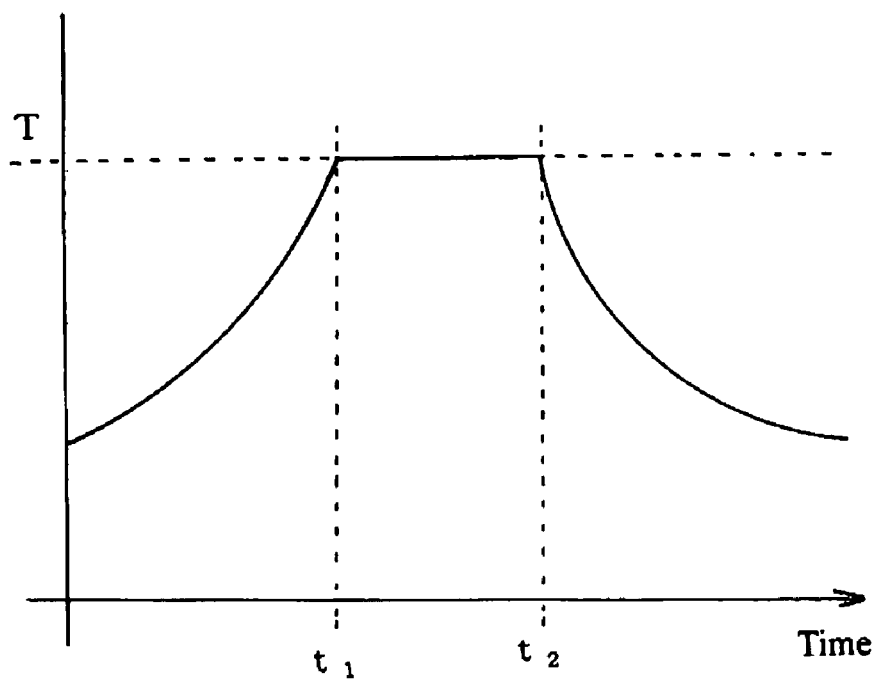
FIG. 8(b) is a temperature program curve showing another example of the heat treatment process that may occur in the substrate heat treatment apparatus of the present invention.
Figure 9:
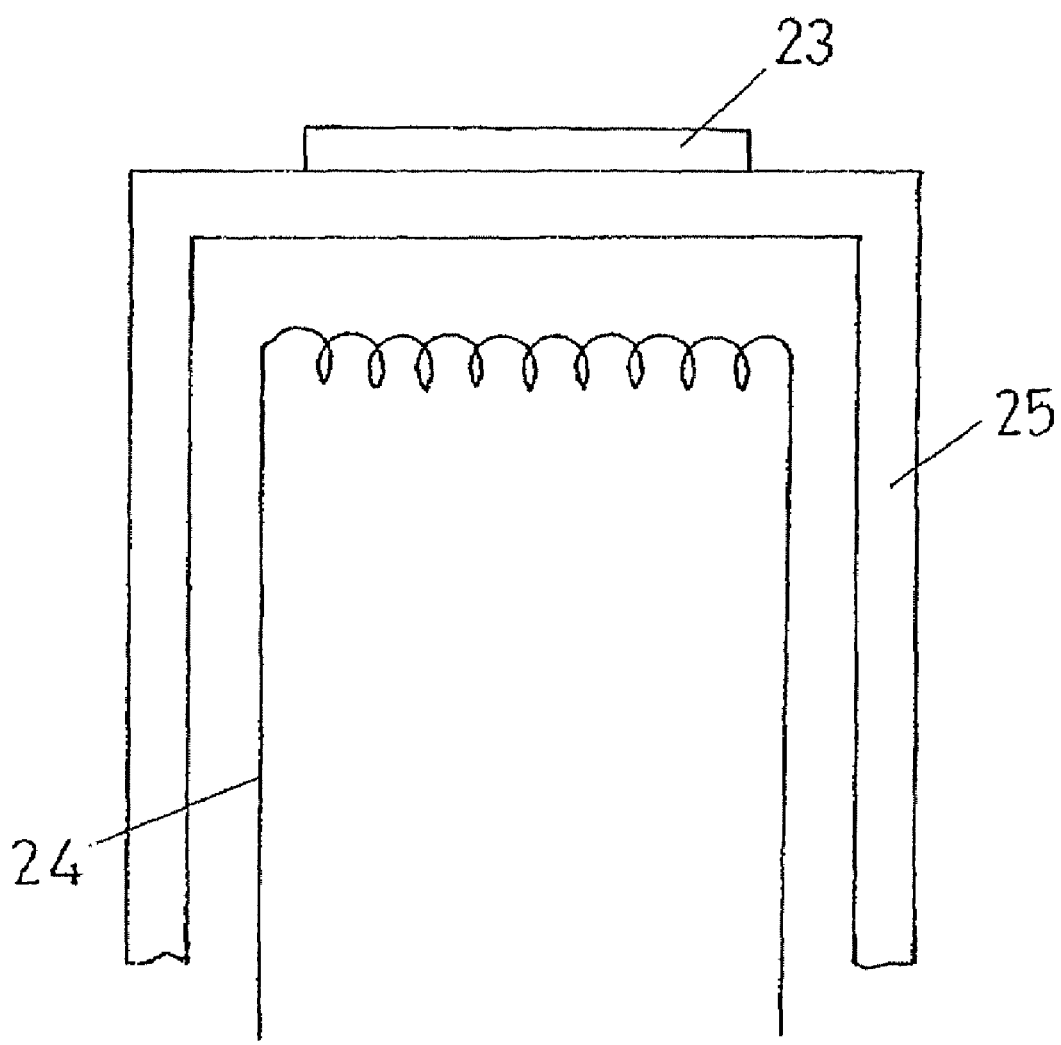
FIG. 9 is a cross section view illustrating the substrate heat treatment apparatus in accordance with the prior art on a partly enlarged scale, although some parts or elements are not shown.

In the semiconductor manufacturing apparatus, various heat treatment processes are employed, such as the process of heating a substrate placed inside the treatment chamber that is evacuated to place it under the vacuum condition or the process of heating a substrate placed inside the treatment chamber that is placed under the atmospheric condition. One typical process is the rapid thermal process (RTP). In the process shown in FIG. 8(a), for example, the heating will continue until the time t, at which time the heating will be stopped immediately. In the process shown in FIG. 8(b), the heating will continue until the time $t_1$, and then the heating will be kept to a predetermined temperature until the time $t_2$, at which time the heating will be stopped.

The type of material that does not degas during the substrate heat treatment process should be selected by considering the requirements for those processes that occur at the high temperatures. For example, such type of material that will not degas at the atmospheric pressures of $10^{-4}$ Pa, at the temperatures of between 800° C. and 2300° C. and during the period of not more than 1800 seconds should be selected. As an example of such type of material, there are pyrolytic carbons such as Pyrolytic Graphite and Pyrolytic Carbon. Any other type of material that will not discharge under the above conditions may also be used.

Next, the substrate transfer tray is now described. This substrate transfer tray may be used in conjunction with the substrate heat treatment apparatus during the heat treatment process, and includes a susceptor incorporating the heating means on the top side of which a substrate being processed thermally may be placed. Specifically, the substrate transfer tray includes a substrate supporting portion that may be disposed on the susceptor and on the upper side of which a substrate being processed thermally by the heating means may be placed, wherein the substrate supporting portion has its outer periphery larger than the outer periphery of the susceptor, and the upper side of the substrate supporting portion is covered with any suitable material that will not degas during the heat treatment process.

When one substrate for which the heat treatment process is completed is to be removed from the susceptor, and another substrate next to be processed is then to be placed onto the susceptor, the preceding substrate remains to be hot. It is therefore necessary to wait for the temperature of that substrate to be lowered, and then remove it from the susceptor. This is time consuming so that the heat treatment process cannot be performed efficiently.

In light of the problem described above, the substrate transfer tray that can be used in conjunction with the substrate heat treatment apparatus includes the susceptor incorporating the heating means on which the substrate may be placed.

Specifically, the substrate transfer tray in accordance with the present invention has its outer periphery larger than the outer periphery of the susceptor, and can be placed on this susceptor. The heat treatment process can proceed with the substrate being placed on the tray and with that tray being placed on the susceptor. When the heat treatment process is completed, the tray with the substrate thereon can be removed from the susceptor without having to wait for the temperature of the substrate to be lowered. Another tray that follows the preceding tray and has a new substrate placed on the upper side of its substrate supporting portion may then be placed onto the susceptor. Then, the heat treatment process may occur for the new substrate. Thus, the heat treatment process can proceed for more than one substrate in sequence.

In this case, at least the upper side of the substrate supporting portion may also be covered with any suitable material that will not degas during the heat treatment process. Thus, the surface roughening that would otherwise be caused to occur on the substrate by the degas from the tray can be avoided.

As a variation of the substrate transfer tray described above, it may include a cylindrical lateral wall portion extending downwardly from the peripheral edge of the substrate supporting portion outside the susceptor, and an annular portion extending radially outwardly from the bottom side of the cylindrical lateral wall portion.

In this variation the cylindrical lateral wall portion extending downwardly from the peripheral edge of the substrate supporting portion outside the susceptor can prevent the temperature distribution from occurring in the substrate supporting portion, thus permitting the heat treatment process to occur more uniformly for the substrate placed on the substrate supporting portion.

In either of the forms of the substrate transfer tray described above, the upper side of the substrate supporting portion on which the substrate is placed may be covered with any suitable material that will not degas during the heat treatment process. Thus, the desorption of the gases from the tray can be prevented during the heat treatment process, and the occurrence of the surface roughening on the substrate can thus be prevented.

Like the preceding cases described so far, in order to ensure that the purpose of preventing degas from the tray and thus preventing the surface roughening from occurring on the substrate during the heat treatment process can be achieved more effectively, it is preferred that the entire surface of the tray from which gases are likely to be emitted should be covered with any suitable material that will not degas.

Like the preceding cases described so far, the type of material that does not degas during the substrate heat treatment process should be selected by considering the requirements for the processes that occur at the high temperatures. For example, the type of material that will not degas at a pressures of $10^{-4}$ Pa, at the temperatures of between 800° C. and 2300° C. and during the period of not more than 1800 seconds should be selected. As an example of such type of material, there are pyrolytic carbons such as Pyrolytic Graphite and Pyrolytic Carbon. Any other type of material that will not degas under the above conditions may also be used.

The following provides a detailed description of several examples of the preferred embodiments of the substrate heat treatment apparatus according to the present invention by referring to the accompanying drawings.

EXAMPLE 1

Figure 2:
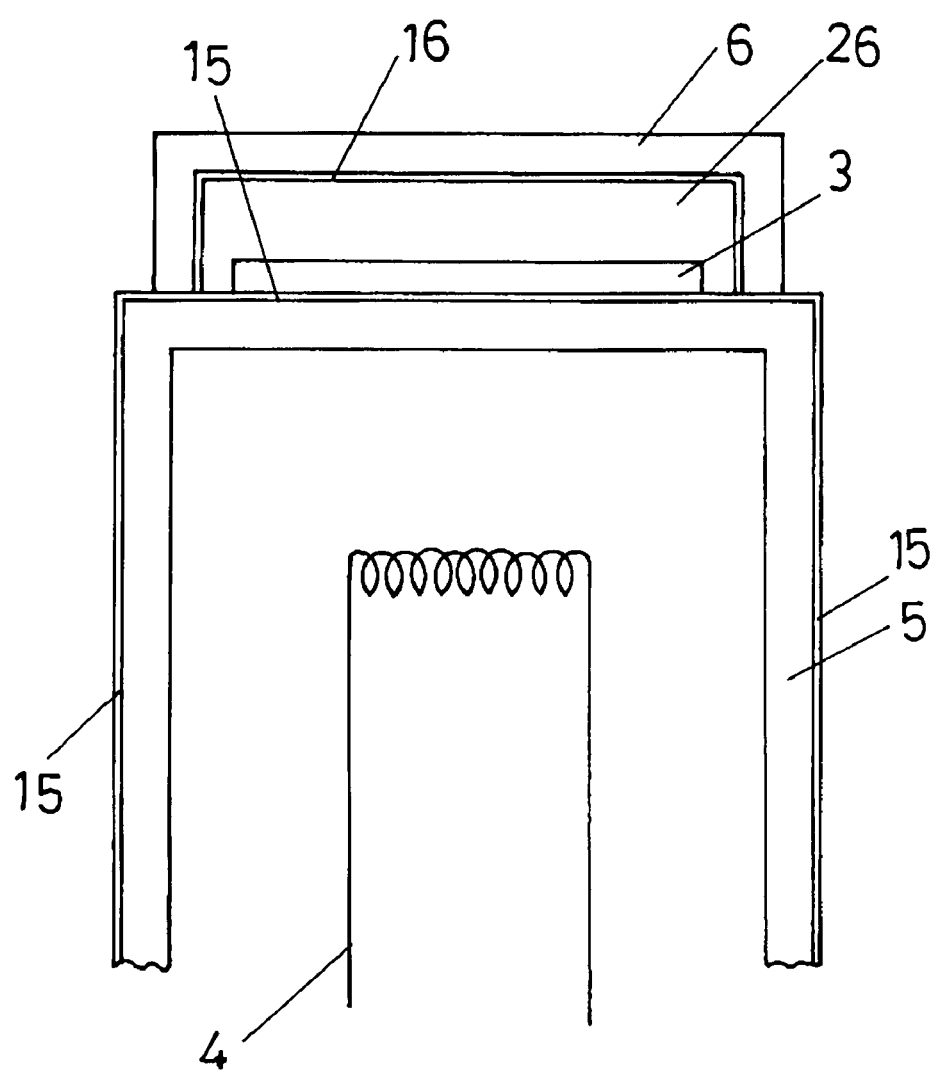
FIG. 2 is a cross sectional view illustrating the substrate heat treatment apparatus of FIG. 1 on a partly enlarged scale.

FIGS. 1 and 2 illustrate the substrate heat treatment apparatus according to a first embodiment of the present invention, wherein the apparatus includes a treatment chamber that can be evacuated to place the chamber under vacuum, and a heating means 4 for heating a substrate 3 placed in the treatment chamber 1. Then, the apparatus permits the substrate 3 to be processed thermally by heating it through the heating means 4.

In the embodiment shown in FIGS. 1 and 2, the heating means 4 is incorporated into a susceptor 5 having a substrate supporting portion thereon in FIG. 1, on the upper side of which a substrate 3 being processed thermally may be placed. As shown in FIG. 2 on an enlarged scale, the susceptor 5 may be disposed between the heating means 4 and the substrate 3 being processed thermally, and the upper side of the substrate supporting portion on which the substrate 3 may be placed is covered by a coating layer 15 of pyrolytic carbons.

As described above, the susceptor 5 may be disposed between the heating means 4 and the substrate 3 being processed thermally, and the surface of the susceptor 5 located on the side thereof on which the substrate 3 is placed may be covered with the coating layer 15 of pyrolytic carbons. During the heat treatment process that occurs in the substrate heat treatment apparatus of the present invention, therefore, the susceptor 5 will not produce gases even if the heating means 4 is heated to the high temperatures of between 1500° C. and 2000° C., for example, thus preventing the surface roughening from being produced on the substrate 3 being processed thermally.

In the embodiment of the present invention shown in FIGS. 1 and 2, the apparatus further includes a heat receiving body that is located on the side thereof facing the susceptor 5 so that it can receive the heat from the heating means 4 through the susceptor 5. The surface of the heat receiving body located on the side thereof on which the substrate 3 is placed may be covered with pyrolytic carbons.

In other words, as shown in FIG. 2, a substrate 3 being processed thermally may be placed on the susceptor 5 incorporating the heating means 4, and a cap 6 that serves as the heat receiving body for receiving the heat from the heating means 4 through the susceptor 5 may be provided on the side of the heating means 4 facing the susceptor 5 with the substrate 3 being placed between the heat receiving body and susceptor 5. Then, the surface of the cap 6 located on the side thereof on which the substrate 3 is placed, that is, the inner side of the cap 6, may be covered with a coating layer 16 of pyrolytic carbons as shown in FIG. 2 on an enlarged scale.

When the cap 6 is mounted on the susceptor 5 for covering the substrate 3 as shown in FIGS. 1 and 2, the cap 6 serves to separate the space 26 inside the cap 6 mounted on the substrate 3 from the space 27 inside the treatment chamber 1.

In accordance with the embodiment shown in FIGS. 1 and 2, the substrate 3 being processed thermally can receive the uniform heat directly from the susceptor 5 as the substrate 3 is placed on the susceptor 5 incorporating the heating means 4.

Figure 3:
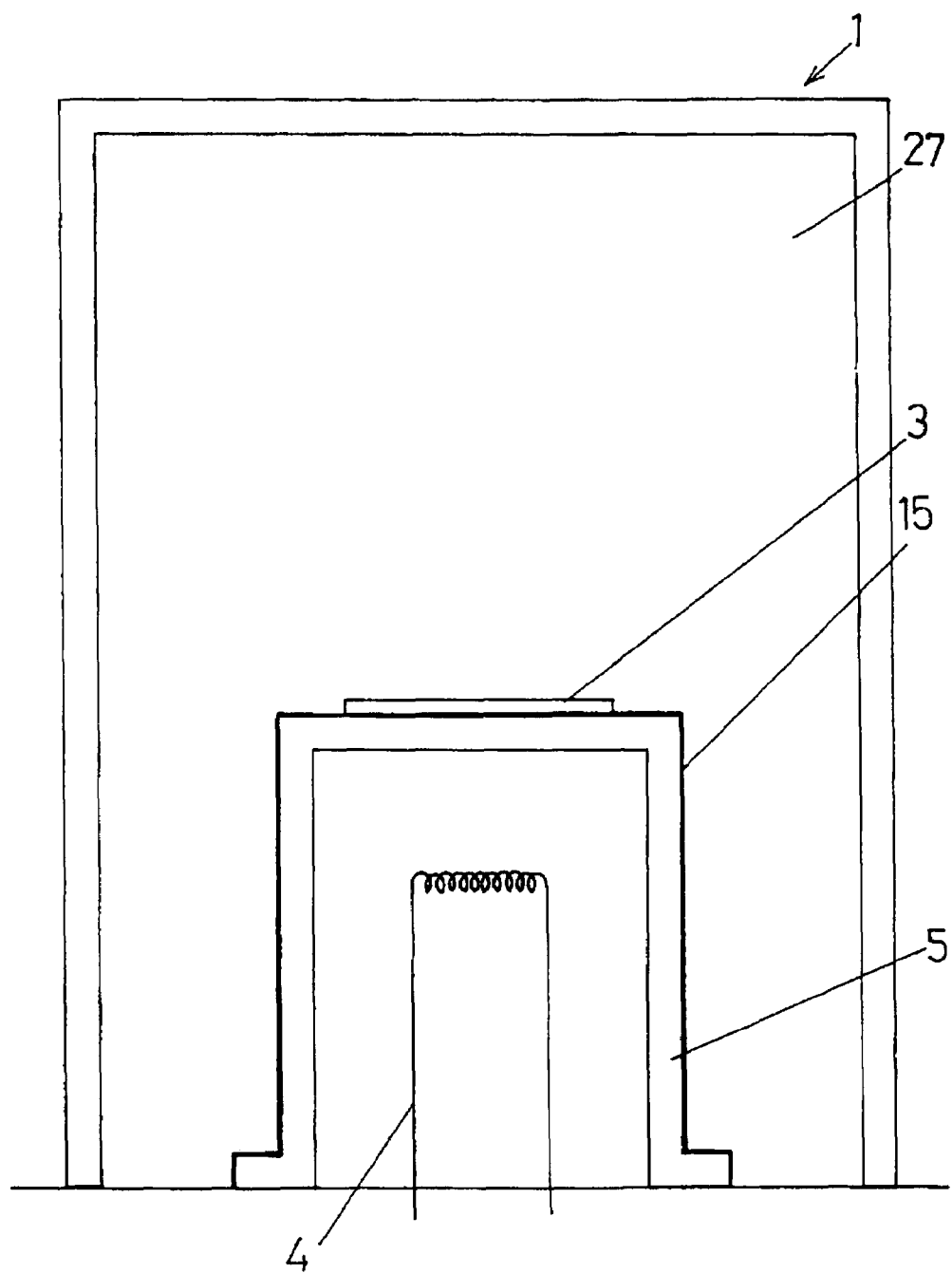
FIG. 3 corresponds to FIG. 1, illustrating a variation of the first embodiment of the present invention.

FIG. 3 illustrates the substrate heat treatment apparatus according to a variation of the embodiment of FIGS. 1 and 2, wherein the cap 6 is not used, that is, the substrate 3 placed on the susceptor 5 is not covered by the cap 6 for separating the substrate 3 from the space 27 inside the treatment chamber 1. In this variation, the substrate 3 can also be heated uniformly and effectively. Note that like parts or elements in the embodiment of FIGS. 1 and 2 and its variation of FIG. 3 are given like numerals in order to avoid the duplicate explanation. In the variation shown in FIG. 3, the surface of the susceptor 5 located on the side thereof on which the substrate 3 is placed, more specifically, the entire surface of the susceptor 5 from which gases are likely to be emitted during the heat treatment process may be covered with a coating layer 15 of pyrolytic carbons.

In the embodiment shown in FIG. 3 like the preceding embodiment of FIGS. 1 and 2, the surface of the susceptor 5 located on the side thereof on which the substrate 3 is placed, that is, at least the upper side of the substrate supporting portion of the susceptor 5 on which the substrate 3 is placed, may also be covered with the coating layer of pyrolytic carbons as indicated by numeral 15. In this way, the occurrence of the rough surface that would otherwise be caused by the gases emitted from the susceptor 5 can be avoided effectively when the substrate 3 is processed thermally at the high temperatures.

In the embodiment of FIGS. 1 and 2, the cap 6 is used to provide the sealing function for the space 26 in which the substrate 3 placed on the susceptor 5 is covered with the cap 6. In accordance with this embodiment, the substrate heat treatment process can occur more effectively because the cap 6 prevents the heat from being emitted from the substrate 3 being processed thermally, as compared with the embodiment of FIG. 3 in which the cap 6 is not used.

In addition, the surface of the susceptor 5 located on the side thereof on which the substrate 3 is placed, more specifically, the upper side of the substrate supporting portion of the susceptor 5 on which the substrate 3 is placed, and the surface of the cap 6 extending toward the side on which the substrate 3 is placed, more specifically, the inner side of the cap 6 that separates the substrate 3 on the susceptor 5 from the space 27 inside the treatment chamber 1, may be covered with the coating layers of pyrolytic carbons, respectively, as indicated by numerals 15, 16.

During the heat treatment process that occurs at the high temperatures, therefore, the occurrence of the surface roughening on the substrate 3 being processed thermally can be avoided more effectively because the cap 6 separates the substrate 3 from the space 27 inside the treatment chamber 1 and the respective coating layers formed on the susceptor 5 and cap 6 can prevent degas from the susceptor and cap, entering into the space 26 inside the cap 6.

The respective coating layers 15, 16 formed on the susceptor 5 and cap 6 may consist of high purity pyrolytic carbons that have been molded into the appropriate shapes, respectively.

The coating layers 15, 16 should preferably have the thickness of between 10 μm and 50 μm, respectively.

When the substrates 3 being processed thermally are SiC substrates, for example, the heat treatment process may proceed at the high temperature of 2000° C. or higher. In the embodiment and its variation described above, it is considered that such SiC substrates will be processed thermally at the high temperatures, and the susceptor 5 and cap 6 thus have the respective coating layers of pyrolytic carbons 15, 16 to prevent gases from being emitted from the respective susceptor and cap. The susceptor 5 and cap 6 may be made of SiC or carbon (more preferably, high purity carbons), and may have the coating layers 15, 16 of pyrolytic carbons formed on the surfaces thereof, respectively.

Although this is not shown, the susceptor 5 and cap 6 may be made of pyrolytic carbons instead of providing the pyrolytic carbon coating layers 15, 16 on the susceptor and cap.

When the heat treatment process is completed for one substrate 3, the cap 6 is left to be cool, and then may be removed from the susceptor 5 either manually or automatically (such as by any proper transfer machine). Then, the substrate 3 may be moved out of the treatment chamber 1, while another substrate 3 may be moved into the treatment chamber 1 where the substrate 3 will be placed on the susceptor 5, and will be covered by the cap 6 if required. Then, the treatment chamber 1 will be evacuated, and the heat treatment sequence as described above will proceed.

The heating means 4 may be implemented by the thermoelectron generator means for the electron impact heating, the infrared lamp for the infrared lamp heating or the like.

EXAMPLE 2

Figure 4A:
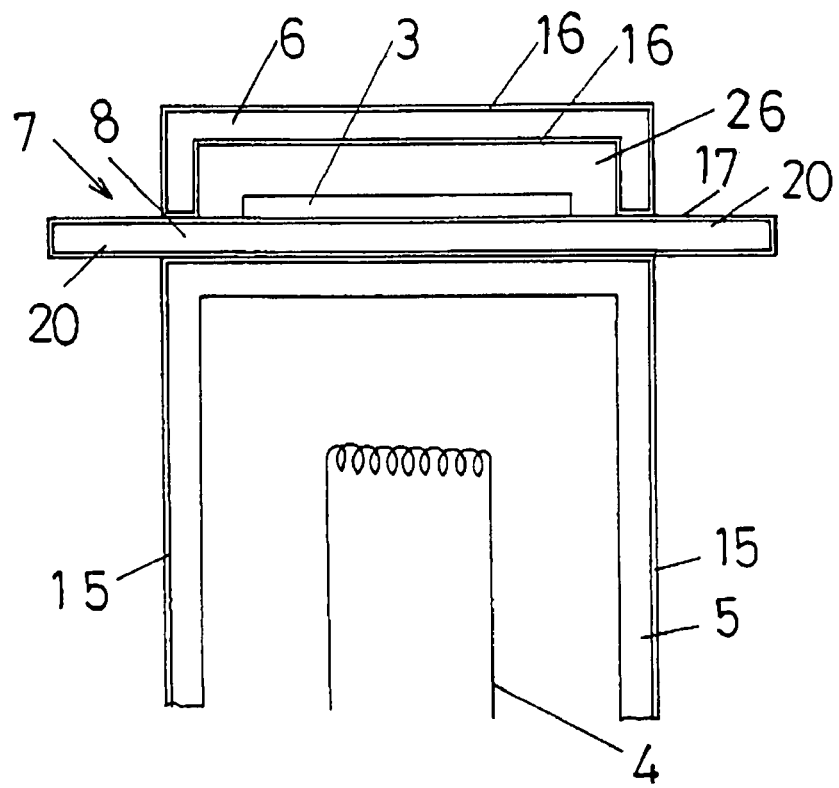
FIG. 4(a) is a cross sectional view illustrating the substrate heat treatment apparatus in accordance with a second embodiment of the present invention on a partly enlarged scale.
Figure 4B:
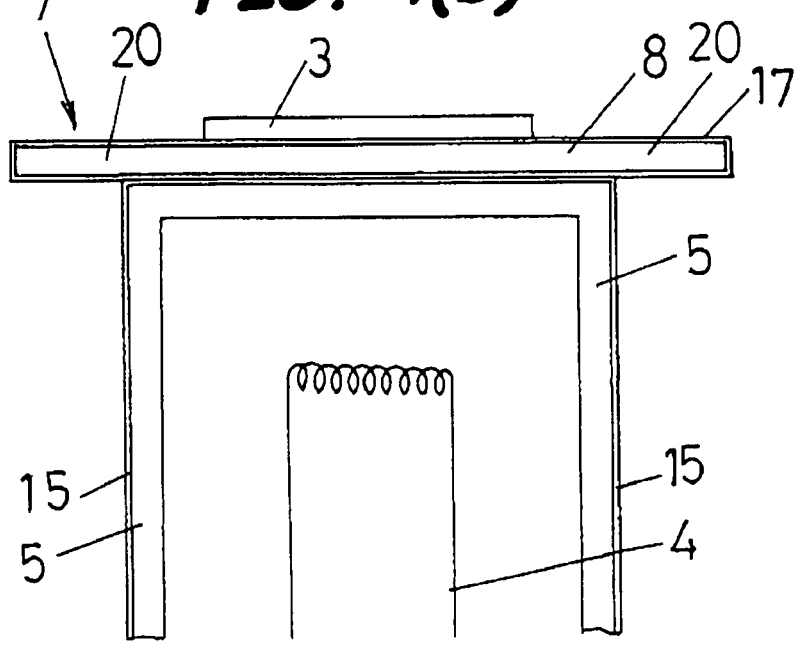
FIG. 4(b) is a cross sectional view illustrating a variation of the second embodiment of the present invention on a partly enlarged scale.
Figure 5A:
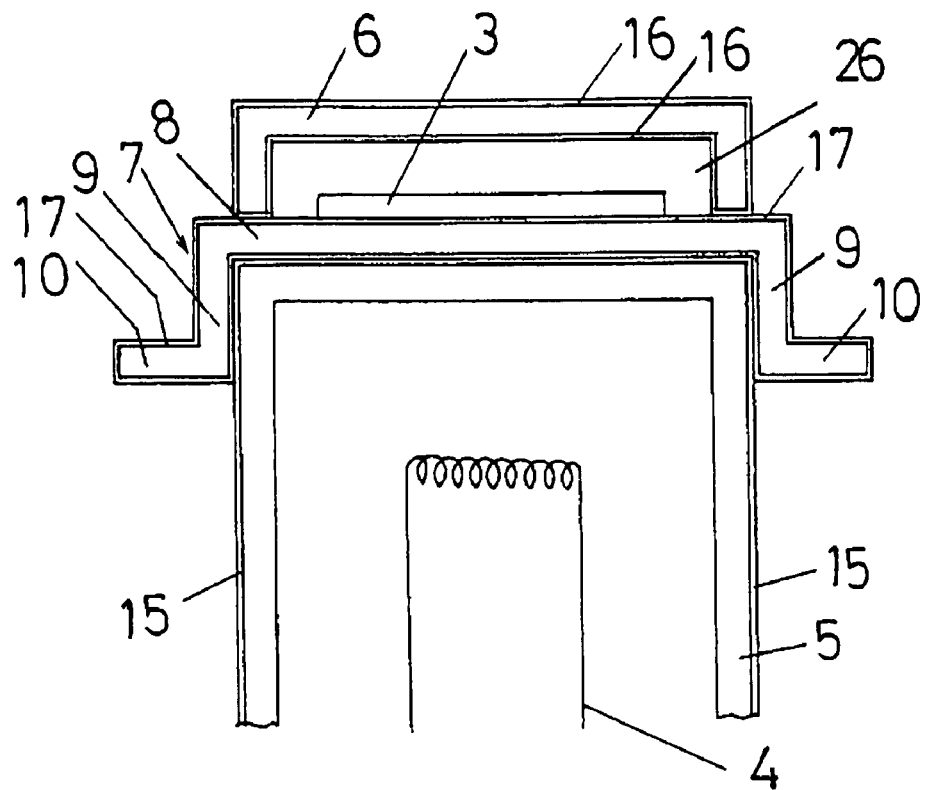
FIG. 5(a) is a cross sectional view illustrating the substrate heat treatment apparatus in accordance with a third embodiment of the present invention on a partly enlarged scale.
Figure 5B:
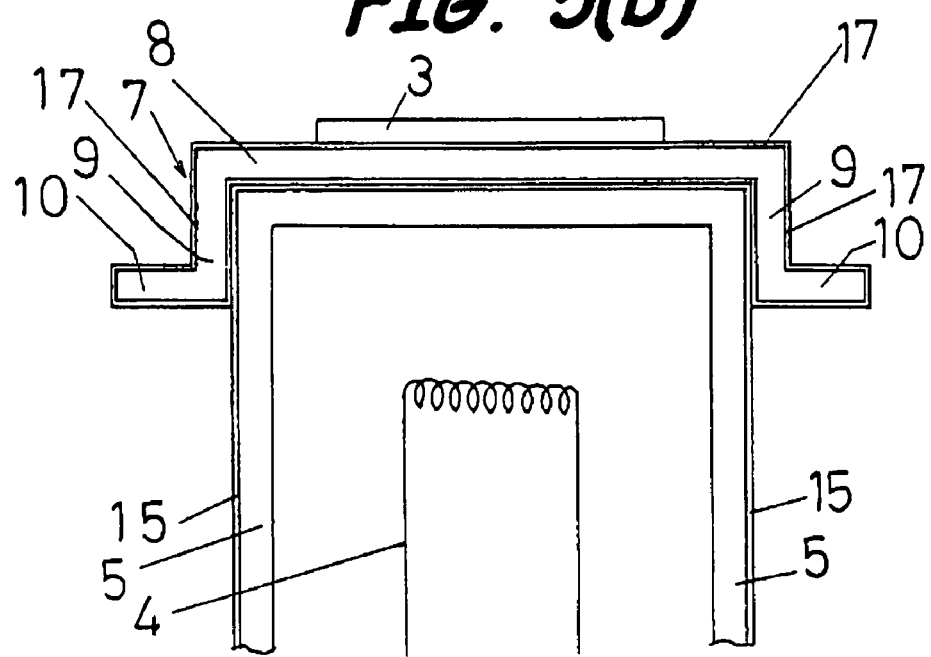
FIG. 5(b) is a cross sectional view illustrating a variation of the third embodiment of the present invention on a partly enlarged scale.

FIGS. 4(*a*), (*b*) and FIGS. 5(*a*), (*b*) represent a second preferred embodiment of the present invention that corresponds to the first embodiment shown in FIG. 2, respectively.

In the embodiment shown in FIGS. 4(*a*), (*b*) and FIGS. 5(*a*), (*b*), those elements or parts that are similar to those in the first embodiment and its variation shown in FIGS. 1 through 3 are given like numerals in order to avoid the duplicate description.

In accordance with the embodiment shown in FIGS. 4(*a*), (*b*) and FIGS. 5(*a*), (*b*), the substrate heat treatment apparatus and the substrate transfer tray that may be used in conjunction with the apparatus are provided. Those embodiments are provided to prevent degas from the susceptor and cap during the high temperature heat treatment process, and to thereby prevent the rough surface from being produced on the substrate 3 being processed thermally, while at the same time they permit the heat treatment process to occur effectively for more than one substrate to be processed in sequence.

In the substrate heat treatment apparatus according to those embodiments, a substrate transfer tray 7, which is not provided in the first embodiment or its variation, is provided. The transfer tray 7 has a substrate supporting portion 8 that may be placed on the susceptor 5 and on the upper side of which a substrate 3 may be placed so that it can be processed thermally by the heating means 4.

Specifically, the substrate transfer tray 7 in the embodiment shown in FIGS. 4(*a*) and (*b*) has the substrate supporting portion 8 on the upper side (the top side in FIGS. 4(*a*) and (*b*)) of which the substrate 3 may be placed so that it can be processed thermally by the heating means 4. As shown, the substrate supporting portion 8 has its outer periphery larger than the outer periphery of the susceptor 5. Thus, the substrate supporting portion 8 is diametrically so large that its peripheral edge portion 20 can project radially outwardly from the outer periphery of the susceptor 5 when the tray 7 is placed on the susceptor 5, as shown in FIGS. 4(*a*) and (*b*). Furthermore, the tray 7 may have the coating layer 17 of pyrolytic carbons at least on the upper side thereof.

In the embodiment shown in FIGS. 5(*a*) and (*b*), the tray 7 has a substrate supporting portion 8 on the upper side of which a substrate 3 being processed thermally by the heating means 4 may be placed, and furthermore has a cylindrical lateral wall portion 9 extending downwardly from the peripheral edge of the substrate supporting portion 8 outside the susceptor 5 and an annular portion 10 extending radially outwardly from the bottom end of the cylindrical lateral wall portion 9. Thus, the tray 7 has its outer periphery that is larger than the outer periphery of the susceptor 5. At least the upper side of the tray 7 is covered by the coating layer 17 of pyrolytic carbons.

Note that FIG. 4(*a*) corresponds to FIG. 2, in which the cap 6 is used as the heat receiving body, while FIG. 4(*b*) corresponds to FIG. 3, in which the cap 6 is not used.

Similarly, FIG. 5(*a*) corresponds to FIG. 2, in which the cap 6 is used as the heat receiving body, while FIG. 5(*b*) corresponds to FIG. 3, in which the cap 6 is not used.

Note that the embodiments shown in FIG. 4(*a*) and FIG. 5(*a*) differ from the embodiment shown in FIG. 2 in that the side of the cap 6 that faces the space 27 inside the treatment chamber is also covered with the coating layer 16 of pyrolytic carbon.

In the substrate heat treatment apparatus according to the second embodiment the heat treatment process may occur with the tray 7 being placed on the susceptor 5 and with the substrate 3 being placed on the tray 7. When the heat treatment process is completed, the tray 7 with the substrate 3 thereon may be removed from the susceptor 5 without having to wait for the temperature of the substrate 3 or of the cap 6 and substrate 3 to be lowered. This removal may be accomplished by operating any suitable transfer machine such as an automatic robot in the manner described below. The automatic robot has a pair of handler at the forward end thereof, and may be operated so that its pair of handler can support the peripheral edge portion 20 or annular portion 10 of the tray 7 from the bottom side thereof in FIG. 4(*a*) through FIG. 5(*b*), the peripheral edge portion 20 or annular portion 10 being lower in the temperature than the substrate 3. Then, another tray 7 having a new substrate 3 placed on the upper side of the substrate supporting portion 8 may be transferred and placed onto the susceptor 5. Then, the heat treatment process may occur for the next substrate 3. In this way, the heat treatment process can proceed efficiently for more than one substrate in sequence.

Similarly to the preceding embodiment, in the second embodiment, the upper side of the substrate supporting portion 8 of the tray 7 on which the substrate 3 is placed may also be covered with the coating layer 17 of pyrolytic carbons, which can prevent degas from the tray 7 during the heat treatment process, thereby avoiding that the surface roughening will occur on the substrate 3.

In the embodiments shown in FIG. 4(*a*)-FIG. 5(*b*), it should be noted that the surface of the tray 7 is entirely covered with the coating layer 17 of pyrolytic carbons so that it can more effectively prevent degas from the tray 7 during the heat treatment process.

Specifically, in the embodiment of FIGS. 5(*a*) and (*b*), the tray 7 includes the cylindrical lateral wall portion 9 extending downwardly from the peripheral edge of the substrate supporting portion 8 outside the susceptor 5, which can more effectively prevent the temperature distribution from occurring in the substrate supporting portion 8 during the heat treatment process. Thus, the substrate 3 on the substrate supporting portion 8 can be heated more uniformly. In this respect, the tray 7 in the embodiment of FIGS. 5(*a*) and (*b*) is more advantageous than the tray 7 in the embodiment of FIGS. 4(*a*) and (*b*) in which the tray 7 has the form of a larger diameter flat plate.

In the embodiment shown in FIGS. 5(*a*) and (*b*), the annular portion 10 on the tray 7 is provided so that it can be supported by the transfer machine when it is transferred by the transfer machine as described above. In order to prevent the temperature distribution from occurring in the substrate supporting portion 8 during the heat treatment process, thereby ensuring that the substrate 3 on the substrate supporting portion 8 can be heated more uniformly, it is preferred that the annular portion 8 should be formed such that it extends radially outwardly from the bottom end of the cylindrical lateral wall portion 9.

In the second embodiment shown in FIG. 4(a) through FIG. 5(b), the surfaces of the susceptor 5, cap 6 and tray 7 are also covered with the coating layers 15, 16 and 17 of pyrolytic carbons, each having the thickness of about 10 µm to 50 µm, respectively.

In accordance with the above, when the heat treatment process occurs at the high temperatures of between 1500° C. and 2000° C., it can be avoided that degas from the susceptor 5, cap 6 and tray 7, respectively, during the heat treatment process, thereby preventing the production of the surface roughening on the substrate 3 being processed thermally.

In the second embodiment shown in FIG. 4(a) through FIG. 5(b), the respective surfaces of the susceptor 5, cap 6 and tray 7 are entirely covered with the coating layers 15, 16 and 17 of pyrolytic carbons, respectively. In this way, the degas from the susceptor 5, cap 6 and tray 7 can be prevented during the heat treatment process, while at the same time the diffusion of the respective materials based on the susceptor 5, cap 6 and tray 7 can also be prevented. Thus, the risk of not only the substrate 3 but also the inner surface of the treatment chamber 1 such as the annealing chamber being polluted with such diffused materials can be avoided.

In the first embodiment and its variation shown in FIG. 1 through FIG. 3, at least the respective surfaces of the susceptor 5 and cap 6 located on the sides thereof on which the substrate 3 is placed are covered with the respective coating layers 15, 16 of pyrolytic carbons so that they can prevent degas from the susceptor 5 and cap 6 and thereby prevent the surface roughening from being produced on the substrate 3 being processed thermally. In the embodiment and its variation shown in FIG. 1 through FIG. 3, the respective entire surfaces of the susceptor 5 and cap 6 may be covered with the respective coating layers 15, 16 of pyrolytic carbons as is the case with the embodiments shown in FIG. 4(a) through FIG. 5(b). In accordance with the first embodiment and its variation, therefore, the advantage can be provided since the materials based on the susceptor 5 and cap 6 can be prevented from being diffused from the susceptor 5 and cap 6, and the inner surface of the treatment chamber 1 such as the annealing chamber, as well as the substrate 3, can be protected against being polluted with such diffused materials.

EXAMPLE 3

Figure 6:
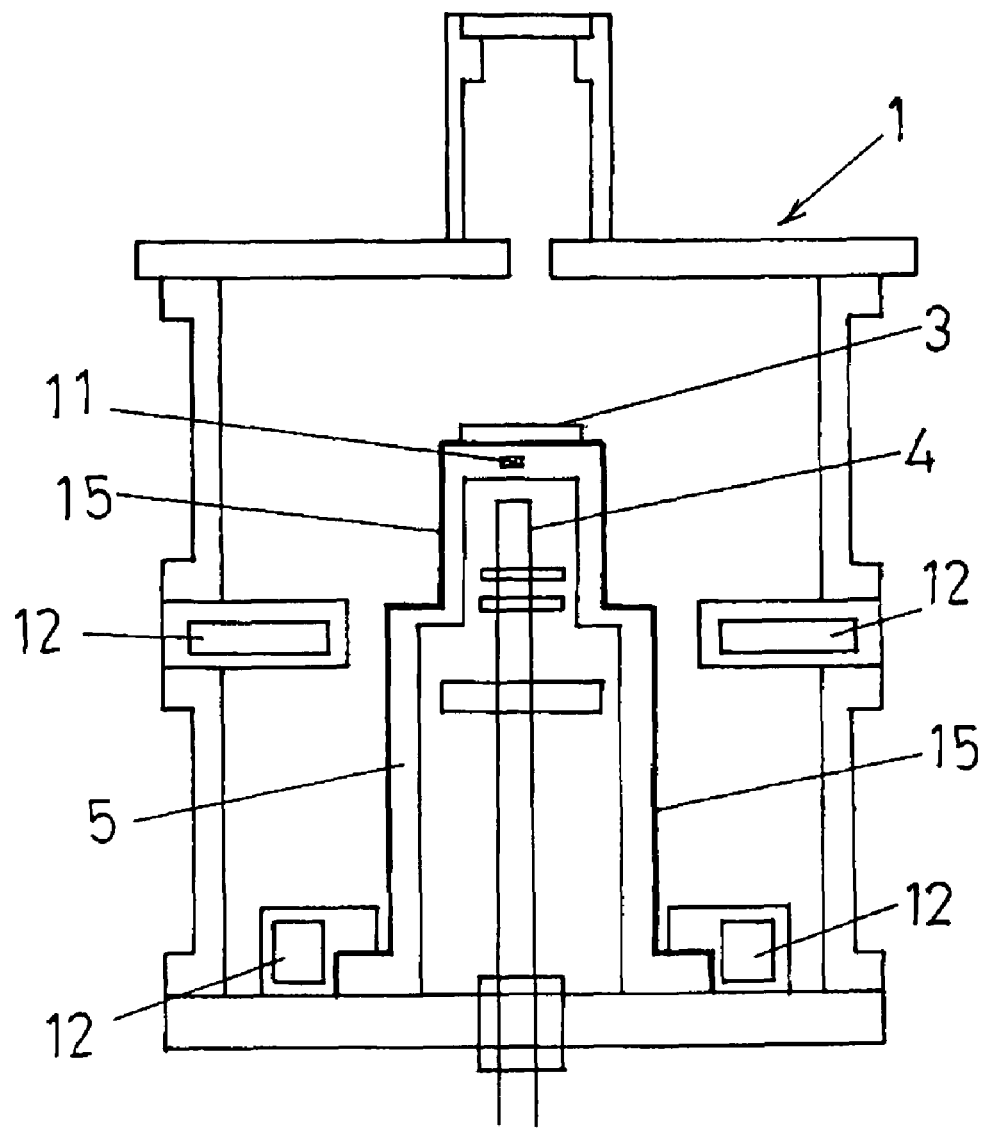
FIG. 6 is a cross sectional view illustrating the substrate treatment apparatus in accordance with a fourth embodiment of the present invention, although some parts or elements are not shown.

FIG. 6 represents the embodiment of the substrate heat treatment apparatus, in which, similarly to the embodiments shown in FIGS. 1 through 3, the apparatus includes the heating means 4 for heating a substrate 3 placed in the treatment chamber 1 that can be evacuated so that the substrate 3 can be heated by the heating means 4 within the treatment chamber 1 under the vacuum condition.

As shown in FIG. 6, the treatment chamber 1 is an annealing chamber made of aluminum, and its inner wall is processed to have the higher reflectivity by the mirror finishing. More specifically, the treatment chamber or annealing chamber 1 is made of water-cooled aluminum, and includes a fluid flow portion 12 through which a coolant fluid can flow. The treatment chamber 1 can be evacuated to place it under the vacuum of about $10^{-2}$ Pa. It may also be placed under the atmospheric condition.

The susceptor 5 incorporates the heating means 4, and has the substrate supporting portion on the top side thereof in FIG. 6, on which the substrate 3 may be placed so that it can be processed thermally. The substrate supporting portion on the susceptor 5 includes a sensor 11 that is sensitive to the heating temperatures. The heating means 4 may include the thermoelectron generator means for the electron impact heating and the infrared lamp for the infrared lamp heating, like those in the preceding embodiments.

The susceptor 5 may be evacuated by any evacuating means such as a vacuum pump, which is provided separately from the treatment chamber 1, so that it can be placed under vacuum of about $10^{-2}$ Pa.

In this embodiment, the susceptor 5 may be disposed between the heating means 4 and the substrate 3 being processed thermally, and the surface of the susceptor 5 located on the side thereof on which the substrate 3 is placed, more specifically, the surface of the susceptor 5 facing the inner wall of the treatment chamber 1 in this embodiment, may be covered with the coating layer 15 of pyrolytic carbons.

In the heat treatment apparatus in accordance with the embodiment of the present invention, the susceptor 5 is disposed between the heating means 4 and the substrate 3 being processed thermally, and the surface of the susceptor 5 located on the side thereof on which the substrate 3 is placed is covered with the coating layer 15 of pyrolytic carbons, so that degas can be prevented from the susceptor 5 and the surface roughening can thus be prevented from occurring on the substrate 3 being processed thermally, even if the heating means 4 is heated to about 1500° C. to 2000° C.

EXAMPLE 4

Figure 7:
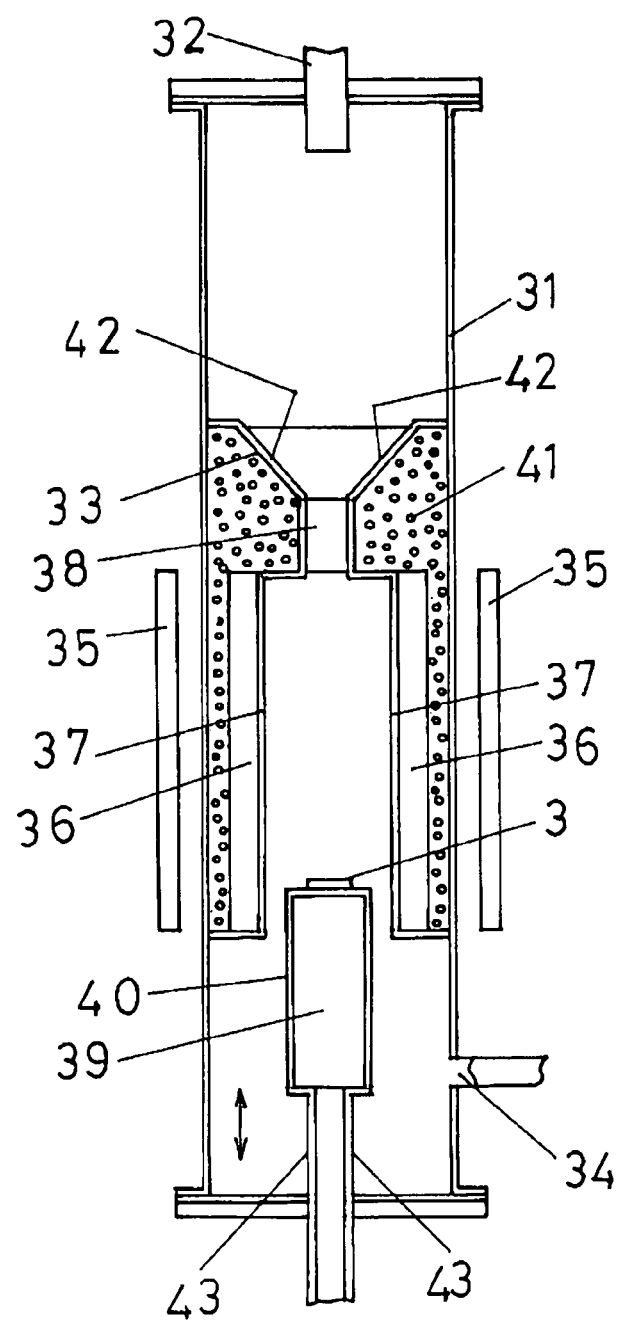
FIG. 7 is a cross sectional view illustrating the substrate treatment apparatus in accordance with a fifth embodiment of the present invention, although some parts or elements are not shown.

FIG. 7 illustrates an embodiment of the present invention, in which the heating means is arranged on the wall side of the treatment chamber that can be evacuated, and the substrate 3 placed in this vacuum treatment chamber may be heated by the heating means on the wall side.

In the vacuum treatment chamber 31, there are a gas supply pipe 32 through which a raw gas used for depositing a thin film on the substrate 3 can be introduced into the treatment chamber 31, and a gas outlet pipe 34 connected to an exhaust means (not shown).

In the treatment chamber 31 of the embodiment shown in FIG. 7, there is also a substrate supporting portion 39 that is capable of moving up and down, on which the substrate 3 may be placed so that it can go through the thin film depositing process or heat treatment process.

A heating means 35 is arranged around the treatment chamber 31.

On the inner peripheral wall of the treatment chamber 31 located on the side thereof on which the heating means 35 is arranged, there is a susceptor 36 that is arranged between the heating means 35 and substrate 3 through the thermal insulating material 41.

The treatment chamber 31 in the embodiment shown in FIG. 7 includes a gas supply pipe 32 through which gases can be introduced into the treatment chamber 31 where the gases go through the funnel-shaped portion 33 and then through the gas supply line 38 into the location of the susceptor 36.

As shown, the surface of the susceptor 36 located on the side thereof on which the substrate 3 is placed, or the portion of the susceptor 36 located on the inner wall of the treatment chamber 31, is covered with a coating layer 37 of pyrolytic carbons.

When the heat treatment process occurs at the high temperatures of between 1500° C. and 2000° C., therefore, the coating layer 37 can prevent degas from the susceptor 36, and can thus prevent the surface roughening from occurring on the substrate 3 during the heat treatment process.

In this embodiment, it should be noted that the entire surface of the substrate supporting portion 39 is covered with a coating layer 40 of pyrolytic carbons, including the upper side of the heat receiving body (substrate supporting surface) that receives the heat from the heating means 35 through the susceptor 36 and which is located opposite the susceptor 36 with the substrate 3 being placed between the susceptor 36 and the heat receiving body.

During the heat treatment process that occurs at the high temperatures of between about 1500° C. and 2000° C., therefore, the coating layer 40 can prevent degas not only from the susceptor 36 but also from the substrate supporting portion 39, thus preventing the surface roughening from occurring on the substrate 3. Thus, the substrate 3 can be processed thermally more effectively.

In this embodiment shown in FIG. 7, furthermore, the inner side of the treatment chamber 31 that is made of thermal insulating material 41, that is, the inner side of the treatment chamber 31 including the funnel-shaped portion 33 and gas supply line 38, may also be covered with a coating layer 42 of pyrolytic carbons, and the outer periphery of the rod portion that supports the substrate supporting portion 39 and corresponds to the inner side of the treatment chamber 31 may also be covered with a coating layer 43 of pyrolytic carbons.

Thus, the emission of gases can be prevented more effectively during the heat treatment process that occurs at the high temperatures of between about 1500° C. and 2000° C.

It may be appreciated from the preceding description of the preferred embodiments of the present invention that the entire inner peripheral wall of the treatment chamber that can be evacuated and inside which a substrate being processed thermally is placed, and the entire surface of each of the members that are exposed to the space inside the treatment chamber may be covered with any suitable material, such as pyrolytic carbons, that will not discharge gases during the heat treatment process, and that the risk of gases being emitted from the inner peripheral wall of the treatment chamber and the surfaces of the members exposed to the space inside the treatment chamber can thus be avoided. This also provides the most effective means of preventing the rough surface from occurring on the substrate during the heat treatment process.

Although the present invention has been described with reference to the several particular preferred embodiments thereof by referring to the accompanying drawings, it should be understood that the present invention is not restricted to those embodiments, which may be modified in numerous ways without departing from the spirit and scope of the invention as defined in the appended claims.

The invention claimed is:

1. A substrate heat treatment apparatus comprising:
   a treatment chamber, an atmosphere of which can be evacuated, and
   a plate which heats a substrate disposed within the treatment chamber, the temperature of the plate being raised to 800° C. to 2300° C.,
   wherein the treatment chamber has a substrate treatment space where a substrate is placed and the substrate treatment space is evacuated into a pressure equal to or less than $10^{-2}$ Pa and the surface of the plate facing the substrate treatment space is coated with a pyrolytic carbon layer of thickness of 10 µm to 50 µm.

2. The substrate heat treatment apparatus according to claim 1, wherein said plate is a part of chamber wall which forms the substrate treatment space.

3. The substrate heat treatment apparatus according to claim 1, wherein the body of said plate is made of carbon which not pyrolytic carbon.

4. The substrate heat treatment apparatus according to claim 1, further comprising a heat receiving body for capping the substrate placed on said plate and the surface of the heat receiving body is coated with a pyrolytic carbon layer.

5. A substrate heat treatment apparatus having heating means for heating a susceptor to a high temperature within a treatment chamber that can be evacuated so that a substrate heated by the high temperature susceptor can be processed thermally in the treatment chamber;
   wherein the susceptor is disposed between said heating means and the substrate, the surface of said susceptor facing a space in which the substrate is placed being covered with a pyrolytic carbon layer, and the apparatus further comprises a heat receiving body for capping the substrate placed on said susceptor to seal the space in which the substrate is placed, the surface of the heat receiving body which faces the space being coated with a pyrolytic carbon layer.

6. The substrate heat treatment apparatus to claim 5, wherein the body of said susceptor is made of carbon which is not pyrolytic carbon.

* * * * *